United States Patent
Nakahara et al.

(10) Patent No.: US 7,345,484 B2
(45) Date of Patent: Mar. 18, 2008

(54) NMR PROBE FOR HIGH-TEMPERATURE MEASUREMENTS

(75) Inventors: Masaru Nakahara, Uji (JP); Nobuyuki Matsubayashi, Uji (JP); Chihiro Wakai, Uji (JP); Takeyoshi Ikeda, Tokyo (JP)

(73) Assignees: Kyoto University, Kyoto-shi (JP); Jeol Ltd., Tokyo (JP)

( * ) Notice: Subject to any disclaimer, the term of this patent is extended or adjusted under 35 U.S.C. 154(b) by 0 days.

(21) Appl. No.: 10/569,854

(22) PCT Filed: Aug. 27, 2004

(86) PCT No.: PCT/JP2004/012786

§ 371 (c)(1),
(2), (4) Date: Feb. 28, 2007

(87) PCT Pub. No.: WO2005/022183

PCT Pub. Date: Mar. 10, 2005

(65) Prior Publication Data

US 2007/0257673 A1  Nov. 8, 2007

(30) Foreign Application Priority Data

Aug. 29, 2003  (JP)  ............................. 2003-305999

(51) Int. Cl.
*G01V 3/00*  (2006.01)
(52) U.S. Cl. ..................... 324/322; 324/318
(58) Field of Classification Search ........ 324/300–322; 600/407–455
See application file for complete search history.

(56) References Cited

U.S. PATENT DOCUMENTS

| | | | | |
|---|---|---|---|---|
| 5,508,613 A | * | 4/1996 | Kotsubo et al. | 324/318 |
| 6,054,855 A | * | 4/2000 | Anderson | 324/318 |
| 7,138,801 B2 | * | 11/2006 | Yamamoto et al. | 324/318 |
| 7,246,939 B1 | * | 7/2007 | Gultekin | 374/44 |
| 2007/0139046 A1 | * | 6/2007 | Haueisen et al. | 324/318 |

FOREIGN PATENT DOCUMENTS

| JP | 3072372 | 9/2000 |
|---|---|---|
| JP | 2001-042229 | 9/2001 |
| JP | 2001-281314 | 10/2001 |
| JP | 2002-196056 | 7/2002 |
| JP | 2003-075523 | 3/2003 |

OTHER PUBLICATIONS

Markus M. Hoffmann and Mark S. Conradi, "Nuclear Magnetic Resonance Probe for Supercritical Water and Aqueous Solutions," Review of Scientific Instruments, vol. 1, Jan. 1997, pp. 159-164.

* cited by examiner

Primary Examiner—Brij B. Shrivastav
(74) Attorney, Agent, or Firm—The Webb Law Firm

(57) ABSTRACT

An NMR probe for high-temperature NMR measurements includes tubular heating means mounted respectively immediately below and immediately above an area to be measured. A sample tube is inserted inside the tube formed by the two heating means. A sample placed in the sample tube is heated. Heat from the two heating means is transmitted to the sample via at least one heat transfer pipe of a good thermal conductivity. The heat transfer pipe is disposed inside the tube of the heating means.

9 Claims, 5 Drawing Sheets

NMR PROBE FOR HIGH-TEMPERATURE MEASUREMENTS

BACKGROUND OF THE INVENTION

1. Field of the Invention

The present invention relates to an NMR probe for use with a high-resolution nuclear magnetic resonance (NMR) spectrometer to perform high-temperature NMR measurements.

2. Description of the Related Art

An NMR probe for high-temperature NMR measurements is an important attachment that is indispensable where researches into physical properties or in site observations of chemical reactions are made using an NMR instrument. Especially, in the field of research into supercritical fluids (where the temperature of an investigated sample needs to be maintained at a high temperature over 400° C.) and in the field of research into inorganic materials, it can be reasonably said that NMR probes for high-temperature NMR measurements are indispensable tools.

The structure of a prior-art NMR probe for high-temperature NMR measurements is shown in FIG. 1. The probe has a fluid intake port 1 for taking in a fluid such as nitrogen gas. A fluid such as nitrogen gas sent in from the fluid intake port 1 flows through a channel formed inside the NMR probe and is heated by a heater 3 mounted on the upstream side of the position of an NMR sample tube 6. Electric power for heating is supplied from an external power supply (not shown) to the heater 3 via a power-supply connector 2.

The channel for fluid is surrounded by a heat-insulating means such as a vacuum double tube 7 to supply the heated fluid into the position of the NMR sample tube 6 while maintaining the high temperature. Thus, the channel is thermally insulated from the outside. The temperature of the fluid is measured by a temperature sensor 4 such as a thermocouple at a temperature-measuring point 5 located immediately below the NMR sample tube 6. The electric power supplied to the heater 3 is controlled based on the value of the measured temperature. That is, where the temperature of the fluid is lower than a preset value, the amount of electric power supplied to the heater 3 is increased. Conversely, where the temperature of the fluid is higher than the preset value, the amount of electric power supplied to the heater 3 is reduced. The fluid such as nitrogen gas can be controlled to a desired temperature because of the structure described so far.

The heated fluid is passed through the thermally insulated channel inside the NMR probe for high-temperature NMR measurements and blown against the NMR sample tube 6. Because of heat exchange between the NMR sample tube 6 and the fluid, the tube 6 is heated to a high temperature. In order to maintain the temperature of the sample tube 6 at a high temperature of 400° C., it is necessary that the heated fluid be sufficiently thermally insulated from the outside environment by the heat-insulating means such as the vacuum double tube 7 and that a heater adapted for high-power applications be used as the heater 3 (see Japanese Patent Laid-Open No. 2002-168932).

However, as shown in FIG. 1, the prior-art NMR probe for high-temperature NMR measurements is designed such that the heated fluid is blown upward from a lower part of the NMR sample tube 6. Therefore, the bottom of the sample tube 6 is at the highest temperature. The temperature drops with going toward the top of the sample tube 6. Therefore, there is the problem that a temperature gradient is produced along the height of the NMR sample tube 6. The temperature gradient becomes steeper with increasing the set temperature of the fluid. Also, as the outside diameter of the used sample tube 6 is increased as encountered where a sample tube of a large diameter such as more than 10 mm is used, the temperature gradient tends to become steeper. Consequently, it is quite difficult to heat the whole volume of the sample within the NMR sample tube at a uniform temperature.

Especially, where the sample is a supercritical fluid, it is necessary to apply high pressure to the sample, in addition to high temperature. Accordingly, the sample tube needs to have a thick wall to withstand the high pressure. As a result, the outside diameter of the sample tube is increased. This results in a steeper temperature gradient.

If the temperature gradient becomes steeper, the supercritical fluid becomes different in nature between the top and bottom of the NMR sample tube. This creates the problem that the obtained NMR data is quite complex. To solve this problem, techniques for mounting a heater over the NMR measurement portion are proposed in the above-cited Japanese Patent Laid-Open No. 2002-168932 and Japanese Patent Laid-Open No.2001-281314.

However, in the above-described prior-art NMR probe for high-temperature NMR measurements, heat from the heater is transmitted to the measured sample via a fluid such as nitrogen gas. Therefore, large-sized fluid supply equipment such as a nitrogen gas cylinder is necessary. In addition, only a small portion of the thermal energy given to the fluid is used to increase the temperature of the measured sample. Most of the thermal energy has been discarded into the atmosphere together with the fluid. For this reason, most of the thermal energy is wasted. In this way, the energy efficiency has been very low.

Additionally, in the prior-art NMR probe for high-temperature NMR measurements, a high-power heater has been used because of low thermal efficiency. Therefore, there is the possibility that a large amount of heat produced from the heater adversely affects electronic parts located around the NMR probe for high-temperature NMR measurements. Accordingly, to avoid this problem, strict countermeasures for thermal insulation and cooling have been essential.

A technique for transmitting the heat from heating means disposed respectively above and below a sample tube to a sample tube via a sample coil for detecting the NMR signal from the sample and via a coil bobbin supporting the sample coil is also proposed (see Japanese Patent Laid-Open No. 2002-196056). However, there is a danger that certain limitations will be produced if a function of transmitting heat to the sample coil and coil bobbin is added while satisfying the essential functions of the sample coil and coil bobbin.

SUMMARY OF THE INVENTION

In view of the foregoing, the present invention has been made. It is an object of the invention to provide an NMR probe which is adapted to be used for high-temperature NMR measurements and which can make milder the temperature gradient produced along the height of an NMR sample tube in high-temperature NMR measurements than heretofore. The NMR sample tube can be a large-diameter sample tube or a sample tube adapted for measurements of supercritical fluids under high-temperature and high-pressure conditions. Furthermore, the NMR probe can make higher the energy efficiency obtained when an investigated sample is heated than heretofore.

This object is achieved by an NMR probe which is built according to the present invention and adapted to be used for high-temperature NMR measurements and which comprises: two tubular heating means mounted respectively immediately below and immediately above an area to be measured by NMR spectroscopy; a first heat transfer pipe disposed inside a tube formed by the heating means and mounted immediately below the area to be measured, the pipe extending upward from the heating means, the pipe covering an area located under the area to be measured; a second heat transfer pipe disposed inside the tube of the heating means and mounted immediately above the area to be measured, the second pipe extending downward from the heating means, the second pipe covering an area located over the area to be measured. A sample tube is inserted inside the two transfer pipes. The sample inside the sample tube is heated by heat that is transferred from the two heating means via the transfer pipes.

The heat transfer pipes are made of gold or a nonmagnetic material that is comparable to gold in thermal conductivity and heatproofness.

The present invention also provides an NMR probe which is adapted to be used for high-temperature NMR measurements and which comprises: two tubular heating means mounted respectively immediately below and immediately above an area to be measured by NMR spectroscopy; and a single heat transfer pipe disposed inside and across a tube formed by the heating means and bridging across the two heating means. A sample tube is inserted inside the single heat transfer pipe. A sample within the sample tube is heated by heat transferred from the two heating means via the heat transfer pipe.

The heat transfer pipe is made of a nonmagnetic ceramic that is comparable to metals in thermal conductivity and heat proofness.

Plural heat-insulating tubes are disposed coaxially with the sample tube and spaced from each other around an area of the sample tube to be measured. An NMR detection coil can be mounted in at least a part of the heat-insulating tubes.

Electric powers supplied to the two heating means mounted respectively immediately below and immediately above the to be measured area can be controlled independently based on the output from a common temperature sensor.

The electric powers supplied to the heating means can be kept constant when an NMR signal from the sample is being detected by the detection coil.

The tube of the heating means, the heating pipe, and the sample tube can be coaxially arranged in intimate contact with each other.

A second pipe made of gold or a nonmagnetic material that is comparable to gold in thermal conductivity and heatproofness can be mounted inside the heat transfer pipe and in contact with the bottom of the sample tube.

The present invention further provides an NMR probe which is adapted to be used for high-temperature NMR measurements and which comprises: two tubular heating means mounted respectively immediately below and immediately above an area to be measured by NMR spectroscopy; a coil bobbin on which an NMR detection coil is mounted; and at least one heat transfer pipe mounted separately from the coil bobbin and disposed in intimate contact with the inside a tube formed by the two heating means. The heat transfer pipe extends from the heating means toward the area to be measured. A sample tube is intimately inserted inside the heat transfer pipe. A sample inside the sample tube is heated by heat transferred from the two heating means via the heat transfer pipe. In this case, the aforementioned at least-one heat transfer pipe can be two separate heat transfer pipes mounted respectively above and below the area to be measured. The at least one heat transfer pipe may be a single heat transfer pipe which is mounted between the upper and lower heating means across the area to be measured.

Other objects and features of the invention will appear in the course of the description thereof, which follows.

DESCRIPTION OF THE PREFERRED EMBODIMENTS

Figure 1:
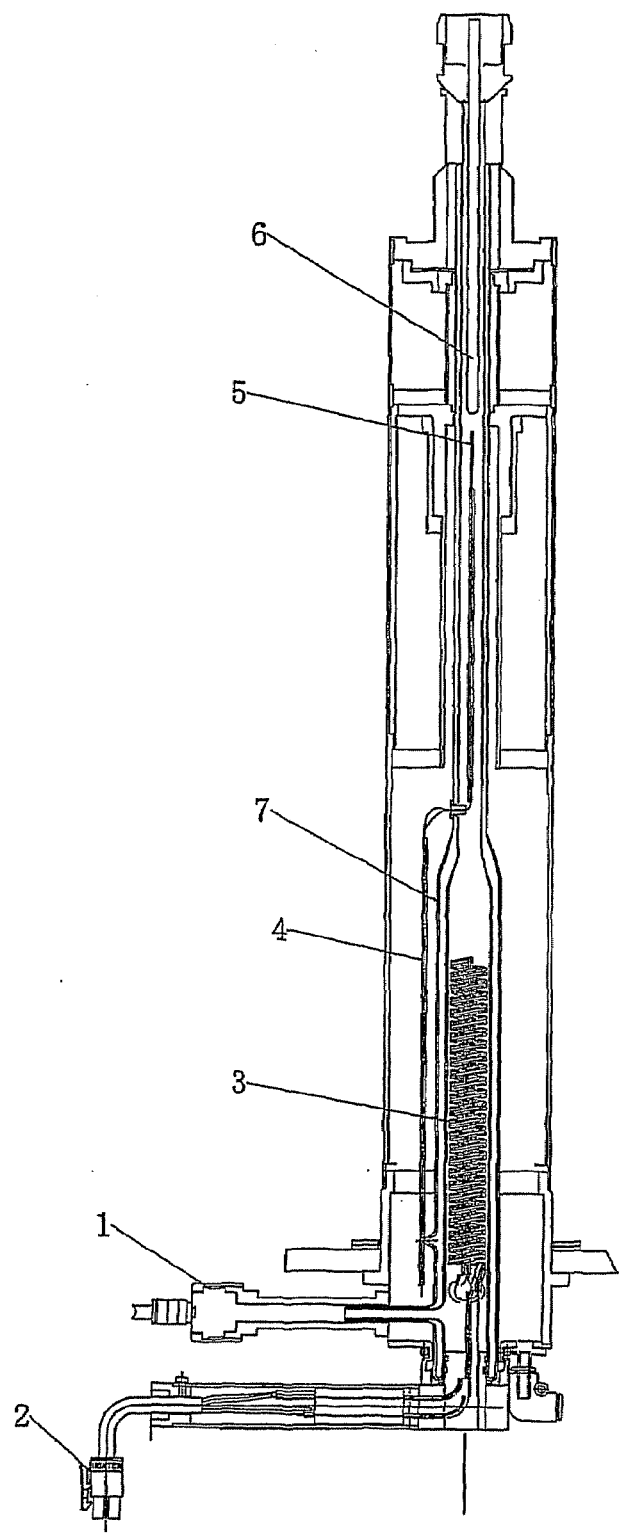
FIG. 1 is a vertical cross section of a prior-art NMR probe adapted for high-temperature NMR measurements.
Figure 2:
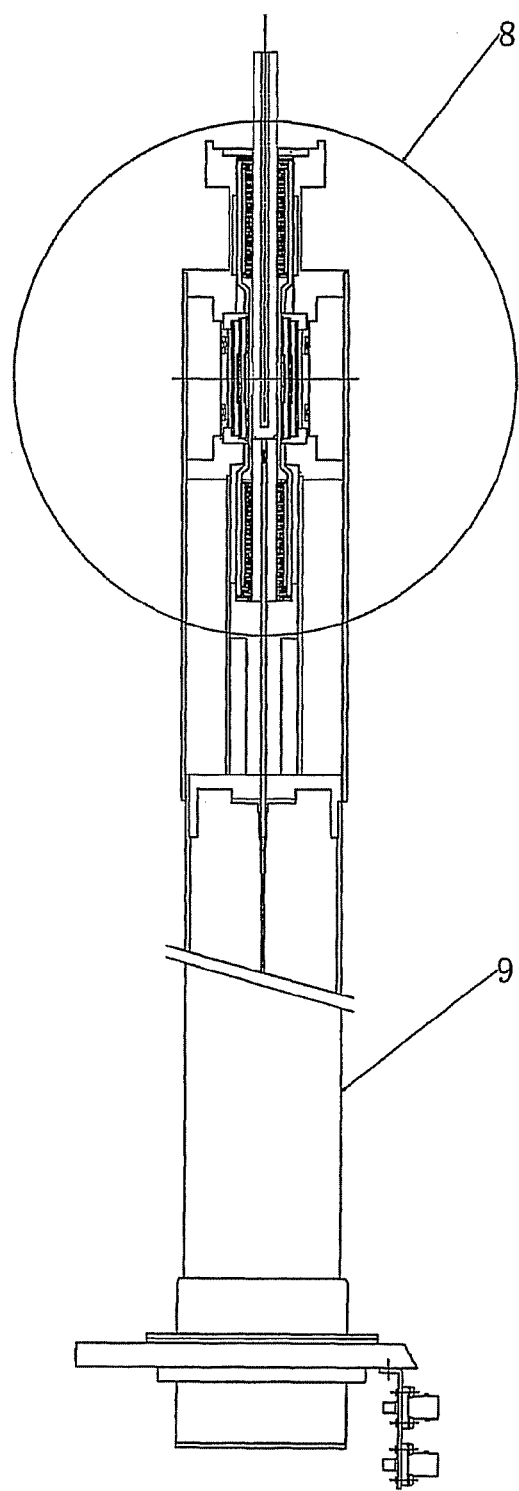
FIG. 2 is a side elevation partially in cross section of an NMR probe according to the present invention, the probe being adapted for high-temperature NMR measurements.
Figure 3:
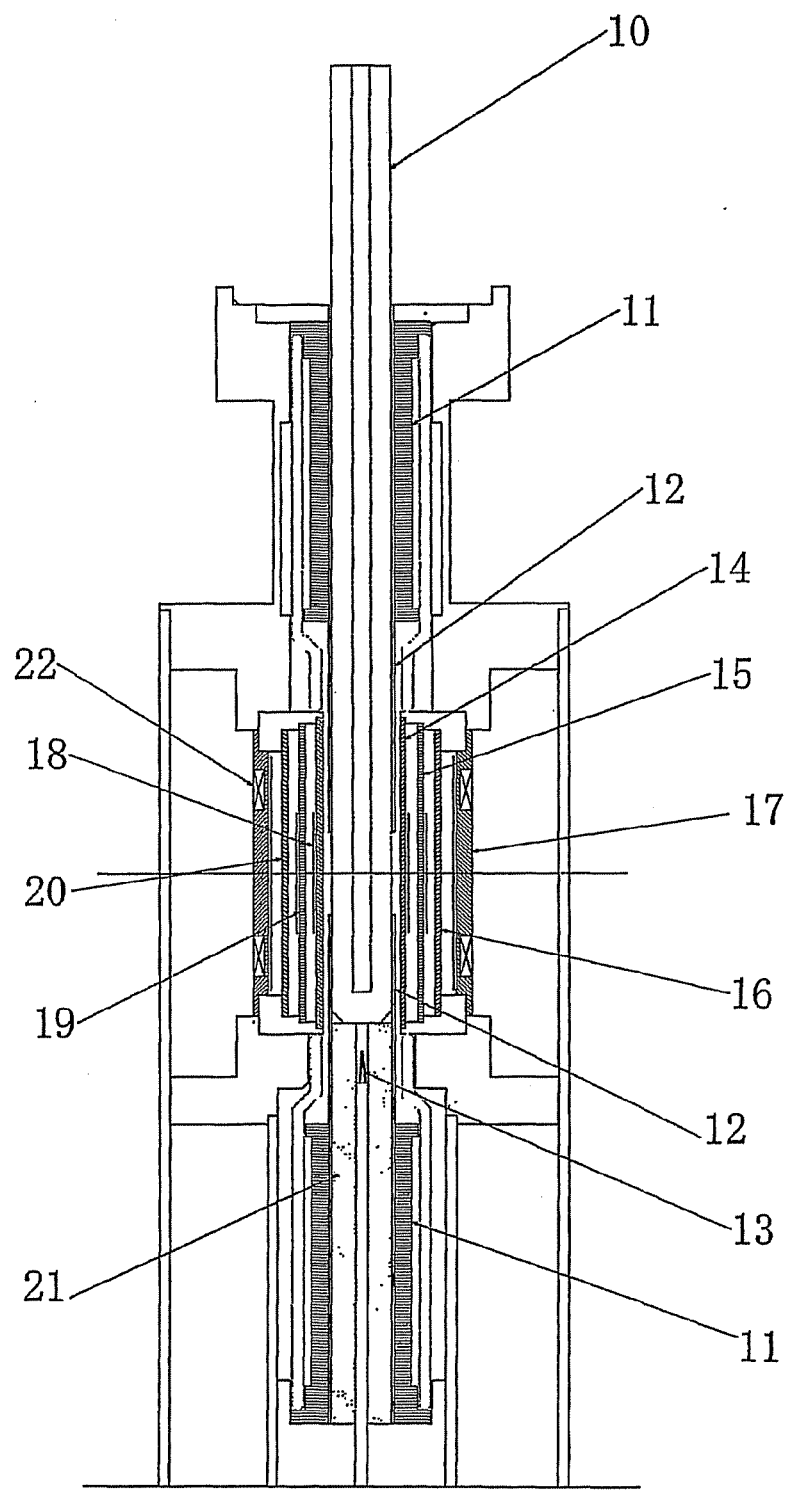
FIG. 3 is an enlarged vertical cross section of the NMR probe shown in FIG. 2.

An NMR probe according to the present invention is fully shown in FIG. 2, the probe being adapted for high-temperature NMR measurements. A cross section of the main portion of the NMR probe is indicated by numeral 8. The whole of the NMR probe is covered by a tubular probe case 9. FIG. 3 is an enlarged view of the main portion 8 of FIG. 2. The structure and operation of one embodiment of the present invention are next described by referring to FIG. 3.

Referring to FIG. 3, tubular heaters 11 mounted respectively immediately below and immediately above an area to be measured by NMR spectroscopy act as heating means. An upper heat transfer pipe 12 and a lower heat transfer pipe 12 are mounted inside the two vertically spaced tubular heaters 11. The upper pipe 12 extends downward from the upper tubular heater 11 and covers the area located over the area to be measured. The lower pipe 12 extends upward from the lower tubular heater 11 and covers the area located under the area to be measured. Only the area to be measured is not covered by the heat transfer pipes 12 but is open as a window to permit an RF magnetic field to be applied to the investigated sample.

An NMR sample tube 10 filled with the sample is inserted in the two vertically spaced heat transfer pipes 12. Heat from the tubular heaters 11 is transmitted to the investigated sample within the sample tube 10 via the heat transfer pipes 12. The heat transfer pipes 12 are made of a metal, most preferably gold, because gold has a high thermal conductivity and is chemically stable at high temperatures. Accordingly, if a nonmagnetic material that is comparable to gold in thermal conductivity and heatproofness is available, it can be similarly used.

The outside diameter of the heat transfer pipes 12 is slightly smaller than the inside diameter of the tubular heaters 11 and slightly larger than the outside diameter of the NMR sample tube 10. Therefore, the tubular heaters 11, heat transfer pipes 12, and sample tube 10 are arranged coaxially in intimate contact with each other. Heat from the tubular heaters 11 is efficiently transmitted to the sample tube 10 via the heat transfer pipes 12. This method provides a thermal efficiency much superior to the thermal efficiency provided by the prior-art method using heated air and employing supply of a large amount of nitrogen gas. Hence, the electric power consumed is reduced. As a result, the heater power supply can be made smaller.

Heat from the lower tubular heater 11 is transmitted to the NMR sample tube 10 via a pipe 21 made of gold or a nonmagnetic material (such as a metal (e.g., aluminum) or ceramic) comparable to gold in thermal conductivity and heatproofness as well as via the heat transfer pipes 12. The pipe 21 is inserted inside the lower heat transfer pipe 12 and in contact with the bottom of the sample tube 10. Therefore, where the NMR sample tube is made of a ceramic of high thermal conductivity such as sapphire or aluminum nitride, the heat transfer effect of the present invention becomes more conspicuous. A hole is formed in the pipe 21 along the center axis. A temperature sensor 13 such as a thermocouple is mounted in the hole.

The outer periphery of the NMR sample tube 10 is thermally insulated from the outside environment of the probe by four layers of thermally insulating tubes 14, 15, 16, and 17 disposed coaxially with the tube 10. The insulating tubes 14-17 are made of a ceramic material which has a low thermal conductivity and a small dielectric loss and produces no NMR background signal, such as steatite, sintered alumina, or colored glass. The color of the ceramic material is selected to be opaque white to suppress thermal diffusion from the thermally insulating tubes by thermal radiation. The thermally insulating tubes are spaced from each other by a distance of less than 1 mm. These narrow air layers are inserted in each gap between the thermally insulating tubes to hinder convection of air.

A silver mirror 20 is formed on the inner wall of the outermost thermally insulating tube 17 by sticking aluminum foil or the like. The mirror reflects heat leaking toward the outside, thus preventing leakage of heat to the outside. In this case, the thermally insulating tube 16 can be a transparent glass tube. This structure yields better thermally insulating effects than the prior-art vacuum double tube made of transparent quartz glass. Hence, high temperatures exceeding 450° C. can be easily obtained.

At least a part of the thermally insulating tubes is used also as a coil bobbin for the NMR probe for high-temperature NMR measurements. That is, in the present embodiment, a first NMR detection coil 18 is mounted to the outer wall of the innermost thermally insulating tube 14. A second NMR detection coil 19 is mounted to the outer wall of the second thermally insulating tube 15 as counted from the inner side. A magnetic field gradient coil 22 is mounted to the outer wall of the outermost thermally insulating tube 17.

In this way, the diameter of the detection coils 18 and 19 can be set to a value that is smaller than the diameter of the prior-art detection coil by about 20%. The distance between each detection coil and the investigated sample is reduced, improving the NMR detection sensitivity. As a result, an RF probe for high-temperature NMR measurements adapted to be used at high frequencies such as 500 MHz has been put into practical use. Furthermore, the magnetic field gradient coil 22 can be mounted closer to the sample. Consequently, the intensity of the gradient magnetic field applied to the sample can be increased to more than 250 gauss/cm.

Figure 4:
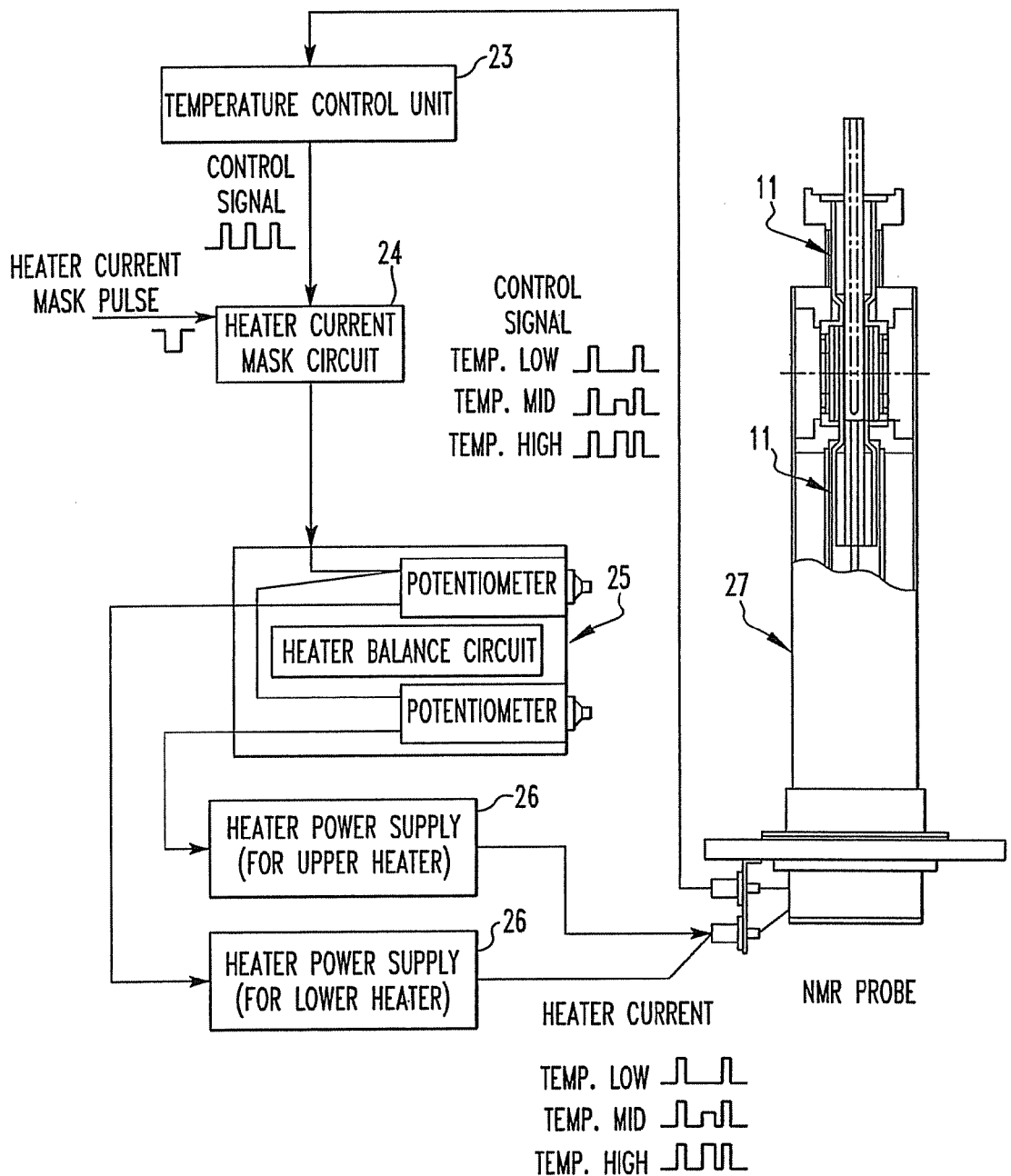
FIG. 4 is a diagram of electronics for use with an NMR probe according to the present invention, the probe being adapted for high-temperature NMR measurements.

The temperature of the sample is measured by the temperature sensor 13 such as a thermocouple mounted immediately below the NMR sample tube 10. The resulting signal is fed back to a temperature control unit, thus stabilizing the temperature. The operation for this temperature control is next described by referring to FIG. 4.

The temperature control unit 23 produces a control signal in the form of pulses in response to the output from the temperature sensor. The control signal is input to a heater current-masking circuit 24. The masking circuit 24 also receives a pulse signal (heater current-masking pulses) produced from the NMR instrument and a signal indicative of a set temperature, the latter signal being produced from the NMR instrument or from the temperature control unit. The pulse signal from the NMR instrument corresponds to the time for which an NMR signal is detected during NMR measurement.

The heater current-masking circuit 24 processes the control signal from the temperature control unit 23 in response to the input signals and in a corresponding manner to the set temperature during detection of the NMR signal such that the heater current is kept at zero or some value. In this way, during detection of the NMR signal, noises due to variation of the heat current are prevented from being superimposed on the NMR signal. Consequently, stable measurement can be performed.

The control signal from the heater current-masking circuit 24 is entered to the remote control input terminal of a heater power supply 26 via a heater balancing circuit 25. The heater power supply 26 supplies an electrical current corresponding to the input control signal to the tubular heaters 11 of the probe body 27.

The heater power supply 26 is split into two units for upper and lower heaters, respectively. The two units are respectively connected with upper and lower tubular heaters 11 of the probe body 27. The heater balancing circuit 25 has a function of adjusting the current intensities of the two units of the heater power supply 26 independently under temperature-controlled state. Thus, it is possible to adjust the balance between the electric powers supplied to the two tubular heaters 11 and to control the temperature uniformity of the to be measured area of the sample in the probe body 27 to the best state. Alternatively, a temperature gradient may be intentionally created across the to be measured area of the sample in the probe body 27.

For example, during measurement of self-diffusion coefficients under high temperature conditions, convection of liquid sample presents a great problem. The convective phenomenon can be effectively prevented by intentionally creating a temperature gradient such that the temperature elevates with going upward. In this way, in the present embodiment, the heater balancing circuit 25 can control the electric powers supplied to the upper and lower tubular heaters 11 independently based on the output from the common temperature sensor 13. Consequently, a desired temperature distribution can be obtained by appropriately setting the temperatures at points above and below the area undergoing NMR measurement.

Figure 5:
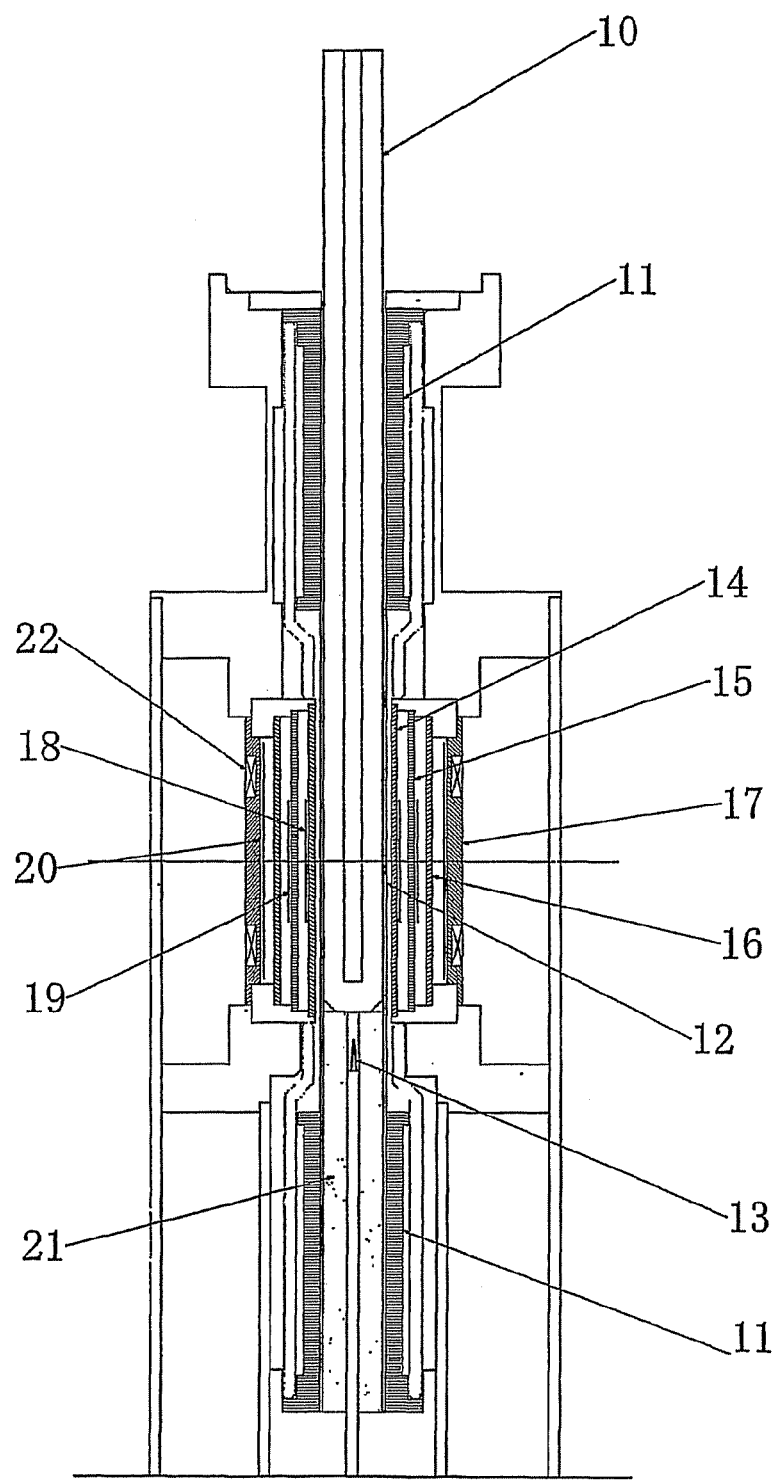
FIG. 5 is a vertical cross section of a further NMR probe according to the present invention, the probe being adapted for high-temperature NMR measurements.

The present embodiment can be modified. FIG. 5 shows another embodiment associated with the present invention. The difference between the embodiments respectively shown in FIGS. 5 and 3 is as follows. In the embodiment shown in FIG. 3, there are vertically spaced heat transfer pipes 12. In FIG. 5, a single heat transfer pipe 12 is disposed inside and across the two tubular heaters 11. This configuration is enabled by adopting a nonmetallic, nonmagnetic ceramic, which is comparable to metals in thermal conductivity and heatproofness and transmits RF waves, as the material of the heat transfer pipe 12. One example of the nonmagnetic material is aluminum nitride, which is comparable to metal aluminum in thermal conductivity. This makes it unnecessary to form a window to transmit RF waves in the NMR measurement portion of the heat transfer pipe 12. In consequence, an NMR probe having a higher mechanical strength and a simpler structure than the NMR probe of FIG.

3 can be offered. Furthermore, the temperature gradient across the to be measured area can be made quite mild by connecting the upper and lower tubular heaters 11 by the single heat transfer pipe 12. Preferably, the material of the heat transfer pipe 12 of FIG. 5 has an excellent thermal conductivity and a small coefficient of thermal expansion, e.g., a material having a thermal conductivity of more than 40 (W/m·K). Examples of materials having thermal conductivities of more than 40 (W/m·K) include aluminum nitride, ceramics consisting mainly of aluminum nitride, sapphire, alumina, and ceramics consisting mainly of alumina. Among them, aluminum nitride having a thermal conductivity of 200 (W/m·K) is especially preferable. These materials can be preferably used also as materials of the vertically split heat transfer pipes 12 shown in FIG. 3.

As described so far, according to the NMR probe built according to the present invention and adapted for high-temperature NMR measurements, tubular heating means are mounted respectively immediately below and immediately above an area to be measured. A sample tube is inserted inside a tube formed by the two heating means, and a sample within the sample tube is heated. Heat from the two heating means is transferred to the sample via heat transfer pipes of high thermal conductivity disposed inside the tube of the heating means. Therefore, the temperature gradient produced vertically across the NMR sample tube during NMR measurement at high temperatures (especially, over 500° C.) using a large-diameter NMR sample tube or a high-temperature, high-pressure NMR sample tube for supercritical fluids can be made milder than heretofore. Furthermore, the sample within the sample tube is heated directly by the heat transfer pipes without via nitrogen gas. Consequently, the energy efficiency achieved when the investigated sample is heated can be made higher than in the prior art. Since the channel for high-temperature fluid such as nitrogen gas is dispensed with, the heat-insulating structure of the probe can be simplified greatly. Further, fluid supply facilities such as a nitrogen gas cylinder that would have been heretofore necessary is dispensed with entirely.

Where a single heat transfer pipe is mounted across the upper and lower heating means, the temperature gradient across the area measured by NMR spectroscopy can be made quite mild. Where this heat transfer pipe is made of a nonmagnetic ceramic comparable to metals in thermal conductivity and heatproofness, it is not necessary to form a window for transmitting RF waves. Consequently, an NMR probe having a higher mechanical strength and a simpler structure can be offered.

The present invention can be applied to a wide variety of NMR probes used for high-temperature NMR measurements. For example, the invention can be effectively employed for researches on structural analyses and steric structures of organic compounds, biopolymers, DNAs, proteins, and so on. According to the present invention, thermal properties of samples can be measured efficiently and accurately even under high-temperature conditions. Therefore, even a compound dissolved, for example, in a supercritical fluid can be observed. Consequently, the invention provides a strong tool for obtaining information about chemical reactions in a super critical fluid or structural information. Accordingly, it is expected that the invention will bring about great strides, as applications of supercritical fluid technology, in researches into various fields including production of polymeric materials such as plastics, synthesis of pharmaceutical materials, production of particulates and porous matter, production and decomposition of composite materials, decomposition and detoxification of persistent harmful organic compounds such as dioxins, treatment of sewage sludge, degradation of plastic wastes into oil, recycling and separation of plastic wastes, extraction of medicinal components and perfumes, condensation and dehydration of alcohols, analysis and oxidation of trace amounts of materials, and creation of clean energy.

What is claimed is:

1. An NMR probe adapted to be used for high-temperature NMR measurements, said NMR probe comprising:
   two tubular heating means mounted respectively immediately below and immediately above an area to be measured by NMR spectroscopy;
   a coil bobbin on which an NMR detection coil is mounted;
   a first heat transfer pipe mounted inside said coil bobbin separated from said coil bobbin and disposed in contact with the inside of a tube formed by said heating means mounted immediately below the area to be measured, the pipe extending upward from said heating means, the pipe covering an area located below said area to be measured; and
   a second heat transfer pipe mounted inside said coil bobbin separated from said coil bobbin and disposed inside of a tube formed by said heating means mounted immediately above the area to be measured, the second pipe extending downward from said heating means, said second pipe covering an area located over the area to be measured;
   wherein a sample tube is inserted in contact with the inside the two transfer pipes and a sample inside the sample tube is heated by heat that is transferred from the two heating means via the heat transfer pipes.

2. An NMR probe adapted to be used for high-temperature NMR measurements as set forth in claim 1, wherein said heat transfer pipes are made of gold or a nonmagnetic material that is comparable to gold in thermal conductivity and heatproofness.

3. An NMR probe adapted to be used for high-temperature NMR measurements, said NMR probe comprising:
   two tubular heating means mounted respectively immediately below and immediately above an area to be measured by NMR spectroscopy;
   a coil bobbin on which an NMR detection coil is mounted; and
   a single heat transfer pipe mounted inside said coil bobbin separately from said coil bobbin and disposed in contact with the inside a tube formed by the two heating means, the transfer pipe bridging across the two heating means;
   wherein a sample tube is inserted inside said single heat transfer pipe and a sample within the sample tube is heated by heat transferred from the two heating means via the heat transfer pipe.

4. An NMR probe adapted to be used for high-temperature NMR measurements as set forth in claim 3, wherein said heat transfer pipe is made of a nonmagnetic ceramic that is comparable to metals in thermal conductivity and heatproofness.

5. An NMR probe adapted to be used for high-temperature NMR measurements as set forth in any one of claims 1 to 4, wherein in said area to be measured, plural heat-insulating tubes are arranged coaxially with the sample tube such that the heat-insulating tubes are spaced from each other, and wherein an NMR detection coil is mounted in at least a part of the heat-insulating tubes.

6. An NMR probe adapted to be used for high-temperature NMR measurements as set forth in any one of claims 1 to 4, wherein electric powers supplied to the two heating means mounted respectively immediately below and immediately above the area to be measured can be controlled independently based on an output from a common temperature sensor.

7. An NMR probe adapted to be used for high-temperature NMR measurements as set forth in claim 5, wherein electric powers supplied to said heating means are kept constant while an NMR signal from the sample is being detected by said detection coil.

8. An NMR probe adapted to be used for high-temperature NMR measurements as set forth in any one of claims 1 to 4, wherein the tubes formed by said heating means, said heat transfer pipes, and said sample tube are coaxially arranged in intimate contact with each other.

9. An NMR probe adapted to be used for high-temperature NMR measurements as set forth in any one of claims 1 to 4, wherein a further pipe made of gold or a nonmagnetic material comparable to gold in thermal conductivity and heatproofness is mounted inside said heat transfer pipes and in contact with the bottom of said sample tube.

* * * * *